(12) United States Patent
Arriens et al.

(10) Patent No.: US 7,843,215 B2
(45) Date of Patent: Nov. 30, 2010

(54) RECONFIGURABLE ARRAY TO COMPUTE DIGITAL ALGORITHMS

(75) Inventors: Dean J. Arriens, Tijeras, NM (US); Paul Short, Albuquerque, NM (US)

(73) Assignee: Quadric, Inc., Albuquerque, NM (US)

( * ) Notice: Subject to any disclaimer, the term of this patent is extended or adjusted under 35 U.S.C. 154(b) by 401 days.

(21) Appl. No.: 12/004,766

(22) Filed: Dec. 22, 2007

(65) Prior Publication Data

US 2008/0218202 A1    Sep. 11, 2008

Related U.S. Application Data

(60) Provisional application No. 60/905,947, filed on Mar. 9, 2007.

(51) Int. Cl.
   *H03K 19/173* (2006.01)
(52) U.S. Cl. ..................................................... 326/38
(58) Field of Classification Search ............ 326/37–41, 326/47, 101
   See application file for complete search history.

(56) References Cited

U.S. PATENT DOCUMENTS 7,342,416 B2 *    3/2008    Feng et al. .................... 326/41

\* cited by examiner

*Primary Examiner*—Rexford N Barnie
*Assistant Examiner*—Thienvu V Tran
(74) *Attorney, Agent, or Firm*—Donald J Lenkszus

(57) ABSTRACT

An integrated circuit comprising a reconfigurable arrangement to compute digital algorithms by operating on digital data is provided on an integrated circuit. The integrated circuit includes a plurality of data inputs, a plurality of data outputs, a plurality of programming inputs and a plurality of logic units arranged as a matrix array. At least some of the logic units each comprise a Boolean logic computational unit having input terminals, output terminals, and programming terminals. The logic units are operated on a clocked basis such that each logic unit is controlled by the programming inputs. Each logic unit comprises a selector coupled to the input terminals and programmable to selectively couple input data from either the data inputs or output terminals of one or more other computational units to the computational unit. An array of programmable interconnects the data inputs of the matrix array and the output terminals of each of the logic units with input terminals of other logic units and to the data outputs of the matrix array. Each of the logic units and each of the selectors and the array of programmable interconnects are operated on a clocked basis such that Boolean functionality is determined during each clock cycle.

29 Claims, 12 Drawing Sheets

RECONFIGURABLE ARRAY TO COMPUTE DIGITAL ALGORITHMS

RELATED APPLICATIONS

This application claims the benefit of and priority based upon U.S. provisional application for patent Ser. No. 60/905,947 filed on Mar. 9, 2007 and is related to co-pending application Ser. No. 11/787,206 filed Apr. 10, 2007 and which claims the benefit of provisional application for patent Ser. No. 60/790,637 filed Apr. 10, 2006. In addition, U.S. patent application Ser. No. 12/004,767 filed on even date herewith, now U.S. Pat. No. 7,479,802 is related hereto. All the patent applications identified herein above are assigned to a common assignee with this application.

FIELD OF THE INVENTION

The invention pertains to digital circuits, in general, and to a reconfigurable digital circuit arrangement, in particular.

BACKGROUND

Field programmable gate array FPGA architectures can be described as a sea of configurable logic locks connected by universal bi-directional interconnect. FIG. 1 illustrates this generalized concept as an array of configurable logic blocks CLB interconnected with a universal switching fabric 103.

Configurable logic computation capability is combined with a small amount of data memory and a small amount of fixed logic into a configurable logic block CLB. A configurable logic computation unit is typically a look-up table, i.e., a small memory, with data to be computed upon going into address bits, and with each location in the memory providing the output required to complete the truth table specified by a logic function. The logic function is defined during the design process. Memory is programmed once upon initial power up and is static thereafter. Data memory is generally implemented as one or two register bits to store the results of the computation between clock cycles. A general configurable logic block CLB example is shown in FIG. 2. A small amount of logic may also be available to enable data connection between several localized computational units.

Configurable logic blocks CLB are connected through a bi-directional interconnect scheme in which any configurable logic block CLB output can be connected to many different configurable logic block CLB inputs using a series of isolation connectors. FIG. 3 shows how wire segments and isolating connectors are used to provide interconnects unique to an algorithm being implemented. The direction of data flow over segments of the interconnect is according to the digital algorithm being implemented. In general, this data flow is unidirectional. Although it is designed to function in either direction, each interconnect is programmed and used in only one direction at a time.

A specific interconnect is performed at power up, with all the configurable logic block CLB inputs and outputs specified through the interconnect. After power up programming is completed, the interconnect is static until the next power-up cycle. The universal nature of the interconnect cannot be changed to optimize differences in interconnect requirements for various parts of the digital algorithm.

A specified set of logic functions within the configurable logic blocks CLB combined with a specified interconnect allows the field programmable gate array FPGA to compute virtually any digital logic function that can fit within the boundaries of the array.

The foregoing approach has several drawbacks including the following:

Configurable logic blocks CLBs and universal interconnect of FPGAs cannot be changed during execution. They are static. While offline, in-system reconfigurability can occur, but requires many clock cycles and occurs in a manner similar to device programming.

The universal interconnect is designed for bi-directional traffic but is used uni-directionally. As fabrication technology increases the dependence of FPGA performance on interconnect, the universal interconnect strategy becomes increasingly inefficient and dominates performance.

The universal interconnect strategy does not adapt to optimize the local and global nature of interconnect in the algorithm under consideration.

The structures needed to program the array take up a large amount of silicon, increasing the cost of the device.

Significant numbers of registers are unused. Their distributed nature makes them unavailable to other parts of the digital algorithm.

The distribution of registers requires data to flow to physically different areas of the FPGA to execute digital algorithms.

The clocking rate of the FPGA computation is determined by the implementation of the digital algorithm.

Although reprogrammability has made the FPGA a powerful solution for some applications, FPGAs remains unsuitable for many applications. Because of the foregoing drawbacks, FPGA are unsuitable for use as dynamic reconfigurable computing structures.

Most digital algorithms are implemented in hardware using a combination of three elements: combinatorial gates to perform boolean logic; registers to store boolean logic; and interconnect to provide boolean connections between the gates and registers.

FIG. 4 shows an organization of these elements that can compute portions of a complete digital algorithm. In this example, two sets of combinatorial computation are placed between three register sets. When combined together, the sets form the complete computation of a digital algorithm. During each cycle, the boolean logic gates are used to further data computation and the registers are used to store data for use during later computation cycles. Inputs and outputs are also shown to enter and leave the combinatorial gate set. As inputs and register values change, unique computations are performed each cycle. A digital algorithm of any size can be computed using a combination of such structures.

Examining this gate-level structure, we have observed that: data flows in one direction between register stages; a significant amount of logic can occur between register stages; and boolean gates provide the capability for a low level of design implementation. In an FPGA, configurable logic blocks CLB provide these capabilities.

We have also observed that in this gate-level structure that only a small subset of gate outputs are registered and that, in an FPGA, it is the interconnect that provides this capability.

SUMMARY

In accordance with the principles of the invention, a reconfigurable array to compute digital algorithms to operate on digital data is provided. The reconfigurable array is on an integrated circuit. The integrated circuit includes a plurality of data inputs, a plurality of data outputs, a plurality of programming inputs and a plurality of logic units arranged as a matrix array. The matrix array of logic units is coupled to the data inputs and the data outputs. At least some of the logic units each comprise a Boolean logic computational unit having input terminals, output terminals, and programming terminals. The programming terminals receive a corresponding portion of the programming inputs. The computational unit is controlled by the portion of programming inputs such that digital signals at the output terminals have a predetermined Boolean combinatorial relationship to the digital signals. The logic units are operated on a clocked basis such that each logic unit is controlled by the programming inputs. Each logic unit comprises a selector coupled to the input terminals and programmable to selectively couple input data from either the data inputs or output terminals of one or more other computational units to the computational unit. An array of programmable interconnects interconnects the data inputs of the matrix array and the output terminals of each of the logic units with input terminals of other logic units and to the data outputs of the matrix array. Each of the logic units and each of the selectors and the array of programmable interconnects are operated on a clocked basis such Boolean functionality is determined during each clock cycle.

In one embodiment of the invention the Boolean computational units are homogeneous whereas in another embodiment of the invention, the Boolean computational units are heterogeneous.

In accordance with an aspect of the invention, each of the logic units and each of the selectors and the array of programmable interconnects are operated and programmed such that Boolean functionality of the integrated circuit may change from clock cycle to clock cycle.

In accordance with another aspect of the invention, a reconfigurable array to compute digital algorithms to operate on digital data is provided. The reconfigurable array is on an integrated circuit. The integrated circuit comprises a plurality of data inputs, a plurality of data outputs, a plurality of programming inputs, and a plurality of programmable clusters, each of the clusters comprising a plurality of logic units arranged as a matrix array. Each matrix array of logic units is coupleable to the data inputs and the data outputs. At least some of the logic units comprise a Boolean logic computational unit having input terminals, output terminals, and programming terminals. The programming terminals receive a corresponding portion of the programming inputs. The computational unit is controlled by the portion of programming inputs such that digital signals at the output terminals have a predetermined Boolean combinatorial relationship to the digital signals. The logic units are operated on a clocked basis such that each logic unit is controlled by the programming inputs. Each logic unit comprises a selector coupled to the input terminals and programmable to selectively couple input data from either the data inputs or output terminals of one or more other computational units to the computational unit. An array of programmable interconnects the data inputs of the matrix array and the output terminals of each of the logic units with input terminals of other logic units and to the data outputs of the matrix array. Each of the logic units and each of the selectors and the array of programmable interconnects are operated on a clocked basis such Boolean functionality is determined during each clock cycle.

In one illustrative embodiment of the invention global pass units couple the plurality of clusters. The global pass units being programmable and operated on a clocked basis.

In accordance with yet another aspect of the invention, a method for computing digital algorithms to operate on digital data is provided. The method comprises the following steps:

providing an integrated circuit comprising having a plurality of data inputs, a plurality of data outputs and a plurality of programming inputs;

providing on the integrated circuit a plurality of logic units;

arranging the plurality of logic units as a matrix array;

coupling the matrix array of logic units to the data inputs and the data outputs;

providing at least some of the logic units as a Boolean logic computational unit each having input terminals, output terminals, and programming terminals;

receiving at the programming terminals of each of logic unit a corresponding portion of the programming inputs;

controlling each logic unit by the corresponding portion of programming inputs such that digital signals at the output terminals have a predetermined Boolean combinatorial relationship to the digital signals;

operating each logic unit on a clocked basis such that each logic unit is controlled by the corresponding portion of the programming inputs;

providing each logic unit with a selector coupled to the input terminals and programmable to selectively couple input data from either the data inputs or output terminals of one or more other computational units to the computational unit;

providing an array of programmable interconnects interconnecting the data inputs of the matrix array and the output terminals of each logic unit with input terminals of other logic units; and operating each logic units and each of the selectors and the array of programmable interconnects on a clocked basis such Boolean functionality is determined during each clock cycle.

Still further in accordance with an embodiment of the invention, each of the logic units and each of the selectors and the array of programmable interconnects is operated on a clocked basis such Boolean functionality of the integrated circuit is changed from clock cycle to clock cycle.

A further method for computing digital algorithms to operate on digital data in accordance with the invention comprises the following steps:

providing an integrated circuit comprising having a plurality of data inputs, a plurality of data outputs and a plurality of programming inputs;

providing on the integrated circuit a plurality of clusters of logic units, each of the clusters comprising a plurality of logic units arranged as a matrix array;

providing at least some logic units as a Boolean logic computational units each having input terminals, output terminals, and programming terminals;

receiving at the programming terminals of each logic unit a corresponding portion of the programming inputs;

controlling each the logic unit by the corresponding portion of programming inputs such that digital signals at the output terminals have a predetermined Boolean combinatorial relationship to digital signals at the input terminals;

operating each logic unit on a clocked basis such that each the logic unit is controlled by the corresponding portion of the programming inputs;

providing each logic unit with a selector coupled to the input terminals and programmable to selectively couple input data from either the data inputs or output terminals of one or more other computational units to the computational unit;

providing an array of programmable interconnects interconnecting the data inputs of the matrix array and the output terminals of each logic unit with input terminals of other logic units; and operating each logic unit and each selector and the array of programmable interconnects on a clocked basis such Boolean functionality is determined during each clock cycle.

BRIEF DESCRIPTION OF THE DRAWING

The invention will be better understood from a reading of the following detailed description in conjunction with the drawing figures in which like designators identify like elements, and in which.

DETAILED DESCRIPTION

In accordance with the principles of the invention, a logic execution array LEA is provided. The logic execution array LEA is a rapidly reconfigurable, fine grained computational array that is a novel hardware architecture that provides a more efficient implementation of digital algorithms than current floating point gate array architectures. A logic execution array LEA in accordance with the principles of the invention overcomes limitations of field programmable gate array design to achieve superior implementation efficiency.

A logic execution array LEA in accordance with the principles of the invention utilizes programming instructions provided at the same rate as data to provide both functionality and interconnect at the same rate as data, whereby the logic execution array LEA can compute digital algorithms according to sequential functionality requirements. Digital algorithms use sequential sets of operations. The logic execution array LEA hardware can be reprogrammed according to logic and register requirements of each algorithmic step. In this way, logic execution array LEA hardware enables an implementation to be optimized according to the sequential set of operations inherent to a digital algorithm and digital algorithms can, in accordance with the principles of the invention reuse logic execution array LEA hardware in a unique and spatially efficient manner.

Figure 5:
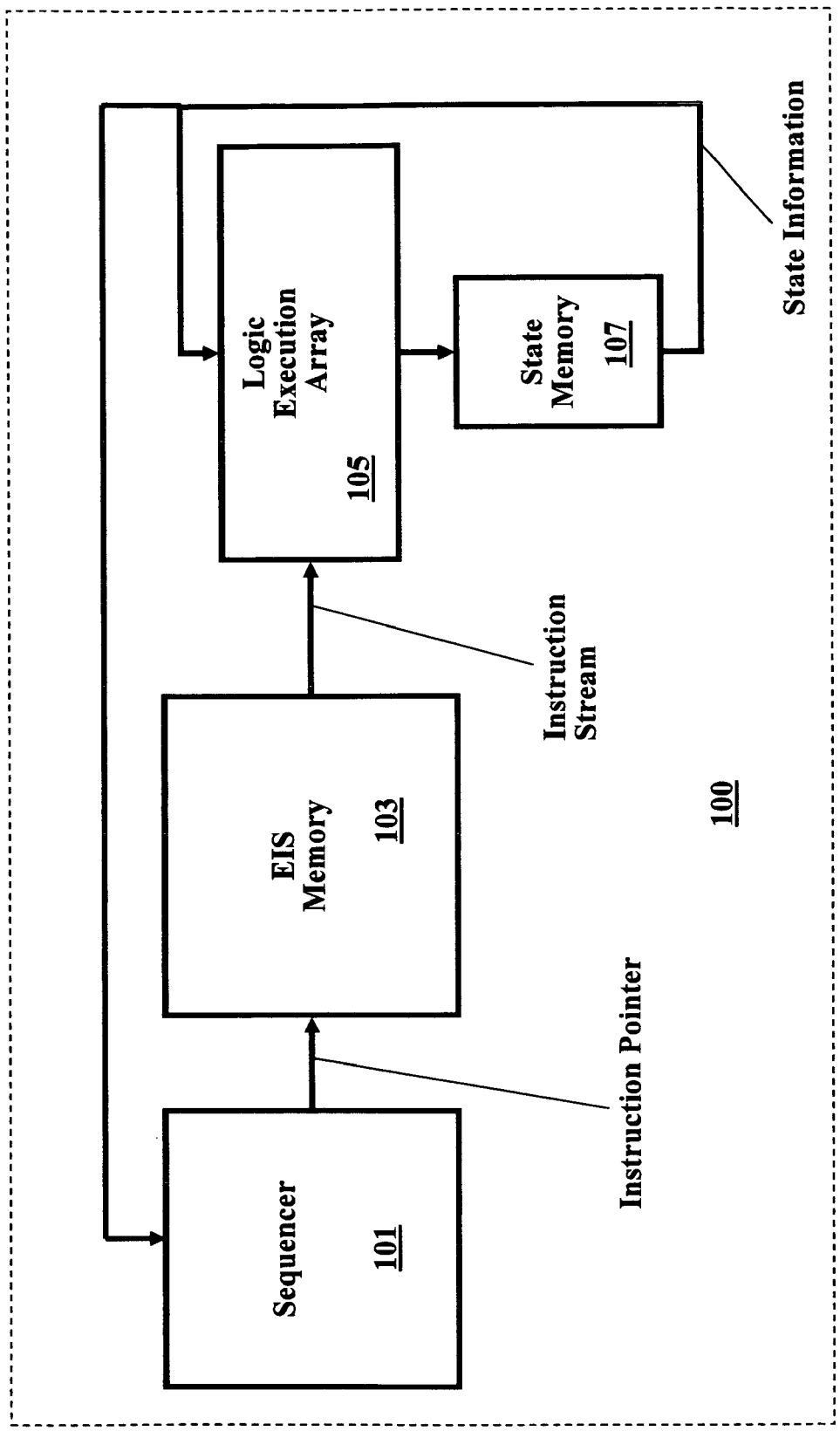
FIG. 5 illustrates a block diagram of a reconfigurable array in accordance with the principles of the invention.

FIG. 5 illustrates integrated circuit 100 which comprises logic execution array (LEA) 105, state memory 107, element instruction stream memory 103, and sequencer 101.

Logic execution array 105 provides a fine grained array of combinatorial, computational units and physical interconnect. State memory 107 provides a unified data memory that supplies inputs to and receives outputs from the logic execution array 105. Element instruction stream memory 103 provides a per cycle programming instruction for the Logic execution array 105 and state memory 107. Sequencer 101 provides a mechanism to associate Logic execution array 105, state memory 107, and element instruction stream memory 103 during each cycle of operation.

During each clock cycle: logic execution array 105 performs a unique combinatorial computation; data is read from and saved to state memory 107; element instruction stream memory 103 provides configuration to logic execution array 105 with meta-instructions; and sequencer 101 selects the ordering of the instruction stream configuration of meta-instructions and the associated data sets to and from state memory 107.

Integrated circuit 100 performs computations necessary at each step of a digital algorithm. Logic execution array 105 is reused at each computation step to provide the appropriate logical and interconnect combinatorial computation. In this way, integrated circuit 100 emulates the logic and interconnects of a traditional digital hardware design illustrated in FIG. 4. State memory 107 is reused at each computation step to provide appropriate sequential data storage across time and clock cycles. In this way, the state memory 107 emulates the registers of traditional digital hardware designs like those shown in FIG. 4.

Figure 6:
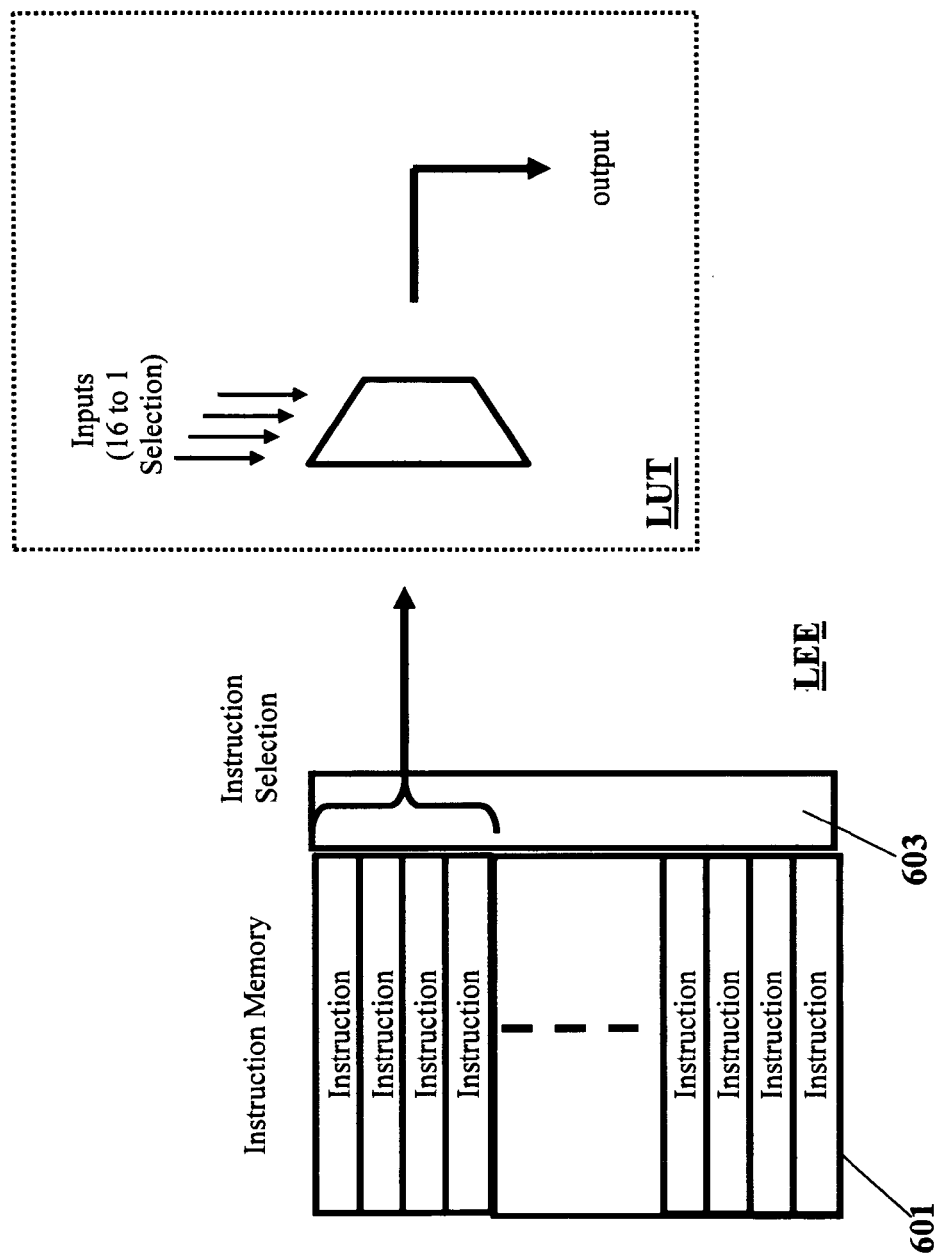
FIG. 6 illustrates one logic execution element in accordance with the principles of the invention.

A logic execution element LEE is a unit capable of per-cycle computation. Although some embodiments can utilize logic execution elements LEE that perform higher level computations, the logic execution element embodiment LEE described herein performs low-level boolean logic functions similar to current hardware design techniques. FIG. 6 shows one logic execution element LEE embodiment configured to perform a specific boolean logic function.

Logic execution element LEE functionality each cycle is similar to a 4 input look-up table in the illustrative embodiment. It is programmed upon power up to perform a specific 4 input, boolean logic function such as ANDs, ORS, etc. The input data bits act as an address into a 16-deep memory. In this, they function like a truth-table to emulate any boolean functionality. FIG. 6 demonstrates logic execution element LEE providing look-up table functionality LUT.

However, unlike a typical look-up table, logic execution element LEE is able to change its function each clock cycle based upon the bits of instruction it receives. Many other embodiments are possible, the illustrative embodiment of logic execution element LEE is a 4 input selector with programmable, truth-table functionality of 16 bit instructions. During each clock cycle an instruction provides the high order address bits, data provides the low order address bits, and the result is a single bit output. For many functions, the full instruction width of 16 bits is not supplied during each clock cycle. Correspondingly, the available number of instructions for functionality of logic execution element LEE is reduced. Supplying full 16 bits of programming each cycle permits $2^{16}$ possible Boolean logic functions for a 4 input look-up table equivalent. Instruction memory 601 and instruction selection 603 shown in FIG. 6 demonstrate a look-up table functionality configuration input. As described herein below, some parts of instruction memory 601 and instruction selection 603 are supplied by element instruction stream EIS memory 103.

Figure 7:
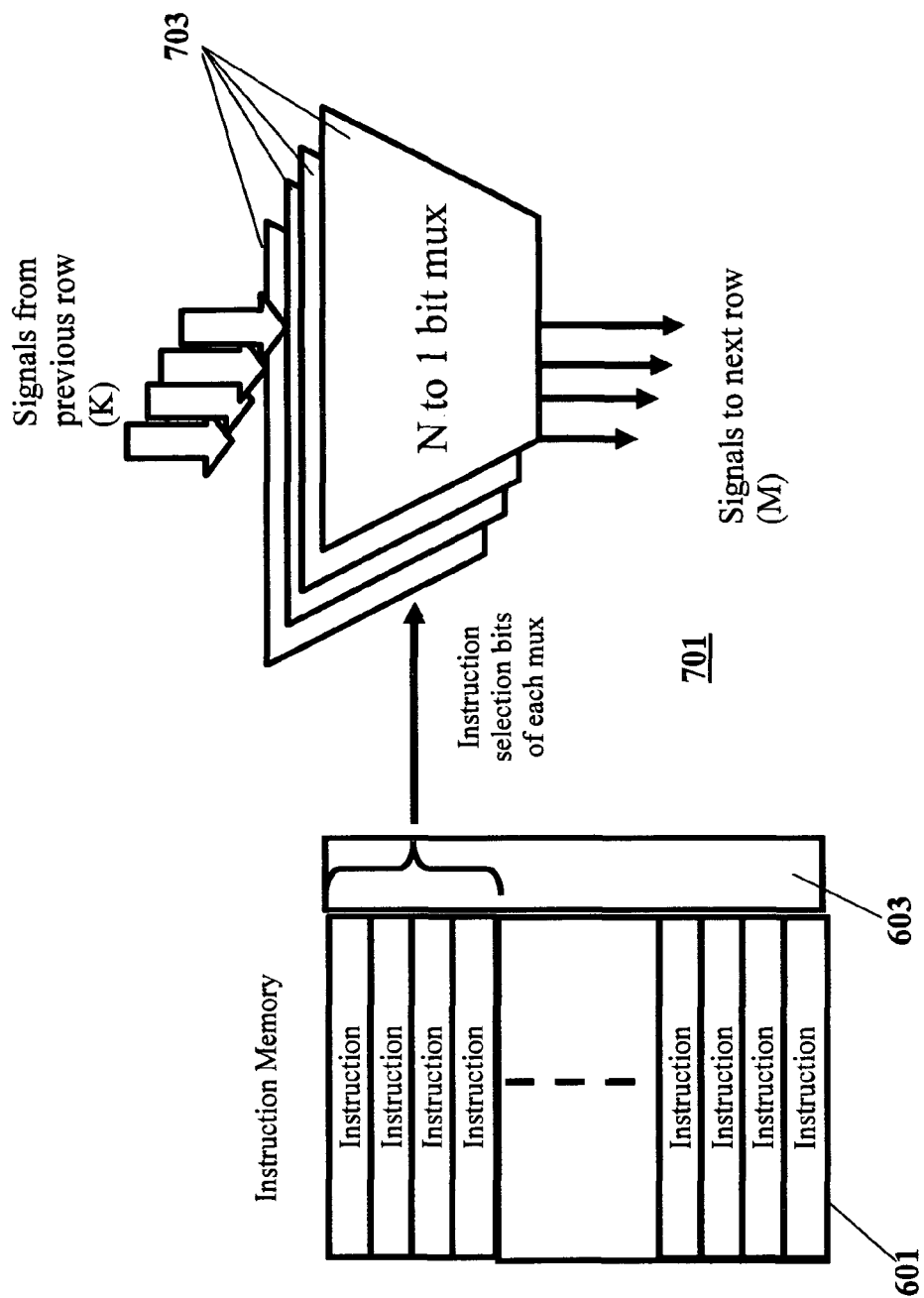
FIG. 7 illustrates a pass unit in accordance with the principles of the invention.

Although one embodiment of logic execution element LEE is described above, many other embodiments are possible, including, but not limited to embodiments including: arithmetic logic units of any width; arrangement gates that produce pre-configured logic functions based upon data and instruction; and multipliers, adders, subtractors FIG. 7 illustrates an embodiment of the lowest unit of reconfigurable interconnect, a logic-level interconnect involving a relatively small number of data bits, referred to as a "pass unit." Pass unit 701 is a K input and M output logical interconnect structure that, in the illustrative embodiment is implemented as a set of K to M multiplexers 703 using a log $2^K$ selector. The four multiplexers 703 shown in FIG. 7 provide an example of this functionality. Although this embodiment utilizes functional multiplexers, other unidirectional interconnect embodiments may be utilized, including, but not limited to pass gates and tri-state drivers.

Pass unit 701 provides interconnect from any K outputs to any M inputs. By way of example pass unit 701 might use an 8 input and 1 output multiplexer 703 and would be referred to as having a window of 8.

Similar to the per-cycle logic execution element LEE programmability, pass unit 701 provides unique connection between outputs and inputs on a per clock cycle basis using an instruction. Instructions may be provided by instruction memory 601 and instruction selection 603 as for logic execution element LEE.

Pass unit 701 provides the lowest level of interconnect configuration. Pass unit 701 functions similar to custom routing arrangements in an ASIC or FPGA design by providing customizable interconnect between computation elements. Pass unit 701 input connections are distributed to the outputs of adjacent and remote logic execution elements LEE. Pass unit 701 provides interconnect functionality with consistent timing delay. The per clock cycle instruction enables interconnects provided by pass units 701 to change every clock cycle.

The number of pass units 701, their placement and window within logic execution array LEA system 100 optimize many factors, including combinations of the following factors: the amount of local interconnectivity associated with a given digital algorithm or class of algorithms; the amount of global interconnectivity associated with a given digital algorithm or class of algorithms; the RC wiring delay associated with a particular fabrication technology; and the expense of providing per-cycle instruction bits.

Pass unit 701 provides a unidirectional interconnect scheme. In this way, pass unit 701 improves the integrated circuit technology and scalability issues associated with the bidirectional field programmable gate array FPGA interconnect.

Figure 8:
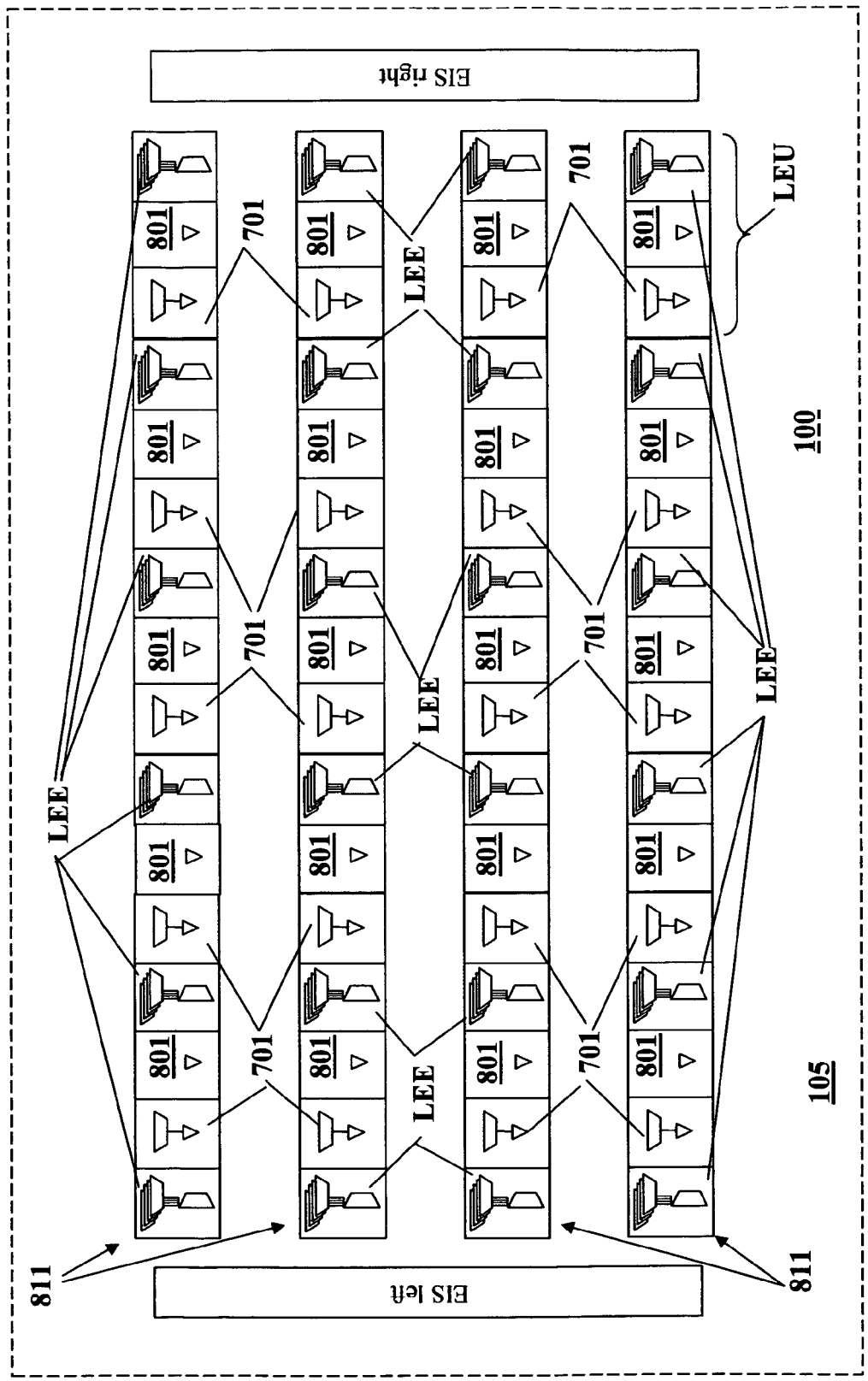
FIG. 8 illustrates an interconnection of logic execution elements and pass units in accordance with the principles of the invention.

One embodiment of a logic execution array LEA 105 is illustrated in FIG. 8. Logic execution array LEA 105 comprises logic execution elements LEE and pass units 701 combined into a fine grained combinatorial computational array of four rows 811 and 16 elements per row. Logic execution elements LEE are arranged into an array in which data computation flows from top to bottom to perform a combinatorial computation. Pass units 701 are distributed and connected in each row 811 to allow data to traverse from one row 811 of logic execution elements LEE to the next. Buffers 801 are provided and are also distributed and connected to allow data to be supplied and received from distant (non-adjacent) locations. In this way, functionality can be more efficiently placed into the logic execution array 105.

All elements within a row 811 of logic execution array LEA 105 meet minimum timing requirements, and thereby, enable a guaranteed timing for the entire array. In this way, timing for the execution by logic execution array LEA 105, regardless of programmed functionality, is kept constant.

In an additional embodiment of logic execution array LEA a 16×16 logic execution element LEE array includes 64 pass units 701 distributed in rows 811. In other embodiments, the array may be of different size and have different logic execution element LEE and pass unit 701 distribution. A logic execution array LEA 105 may be optimized towards specific algorithm classes, with their unique logic computation and interconnect requirements.

To maintain consistent timing, a row 811 of logic execution elements LEE generally receives its inputs directly from the outputs of an adjacent row 811 of logic execution elements, which as shown in FIG. 8, is the adjacent above row of logic execution elements LEE. Each logic execution element LEE and each pass unit 701 have timing delays such that the execution time of logic execution array LEA 105 is consistent even as logic execution element LEE and pass unit 701 programming varies. No data storage is done within logic execution array 105, and computation is done using one clock cycle. In this way, each execution of the logic execution array LEA 105 is performed in one clock cycle of equal time that is independent of the digital algorithm being computed. This consistent timing simplifies timing convergence and allows design in a software programmable logic SPL architecture to enable high-level, software-like implementation techniques.

Figure 9:
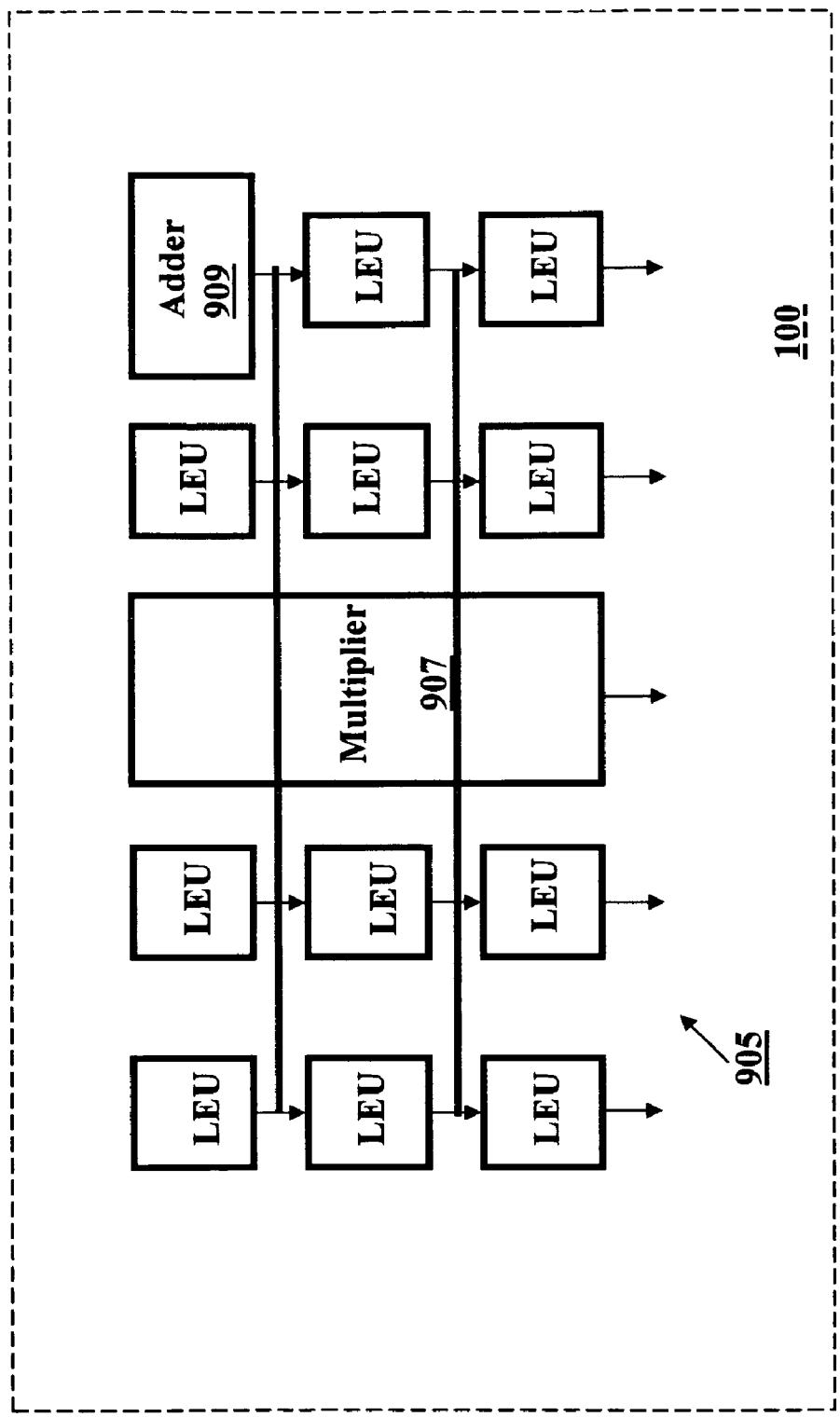
FIG. 9 illustrates a heterogeneous logic execution array in accordance with the principles of the invention.

Although the logic execution element LEE array of the illustrative embodiment is homogeneous, the logic execution element LEE arrays in other embodiments of the invention need not be homogeneous. That is, there could be, in any single instantiation of a logic execution array LEA 105, multiple types of logic execution elements LEE. For instance, there could be a set of columns of look-up tables, and another set of columns that contain multipliers. FIG. 9 illustrates a simplified logic execution array LEA 905 that is not homogeneous, but rather is heterogeneous. For clarity purposes, the combination of logic execution element LEE, pass unit 701 and buffers 801 is identified as a logic execution unit LEU. Logic execution array 905 includes logic execution units LEU and includes a multiplier 907 in place of one column of the array and further includes an adder 909 in place of one logic execution unit LEU. In heterogeneous logic execution array LEA 905, logic execution units LEU can also be allocated the timing associated with multiple columns of execution. In this way, logic execution elements LEE or logic execution units LEU with longer execution time can be accommodated while maintaining the constant timing nature of logic execution array LEA 905. Similarly, the type and distribution of the pass units and buffering does not need to be homogeneous throughout a logic execution array LEA.

Figure 10:
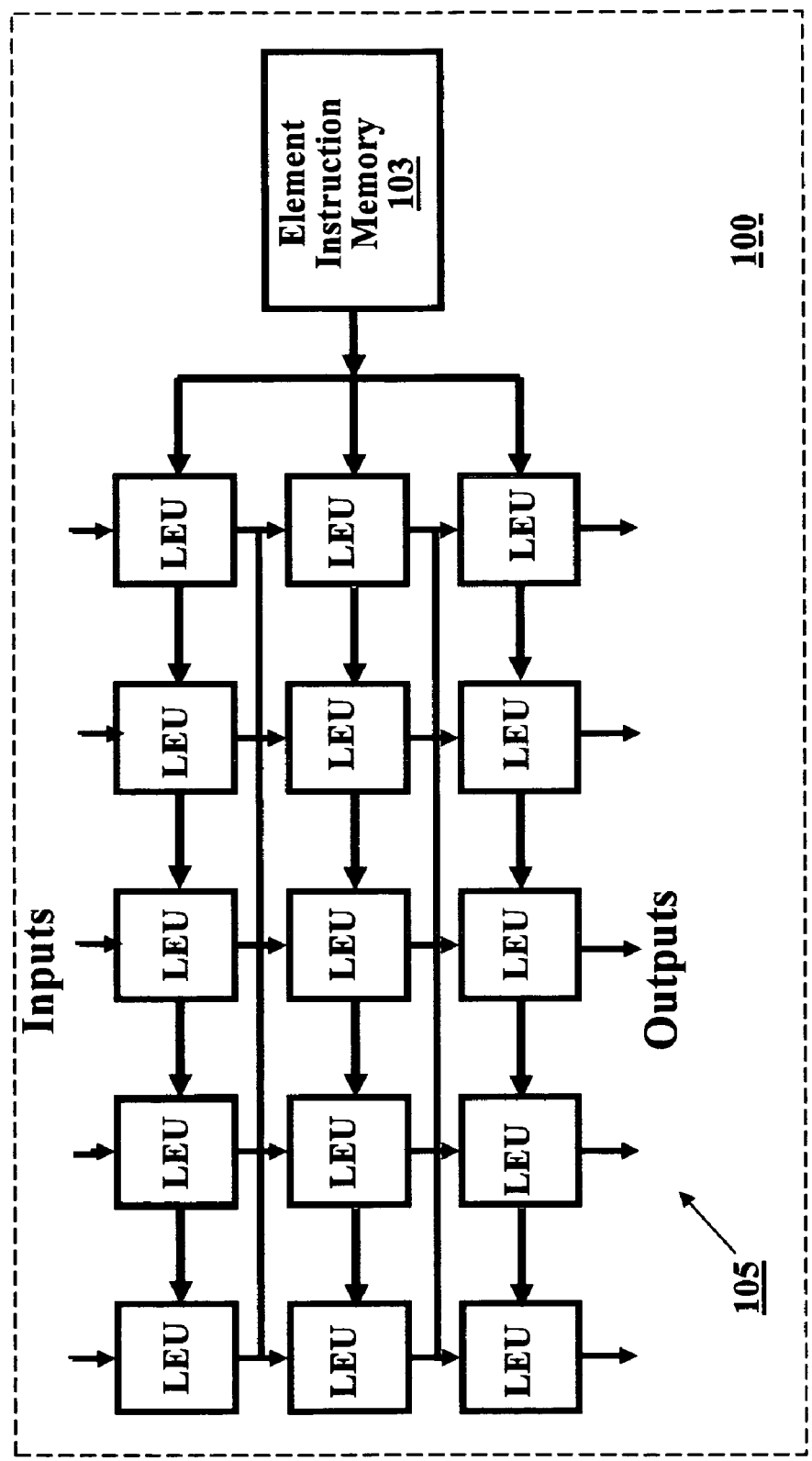
FIG. 10 illustrates the utilization of a logic execution array in conjunction with memory utilized to control configurations of the logic execution array.

Turning now to FIG. 10, a memory 103 is provided to store logic execution array LEA 105 configurations. During each clock cycle, memory 103 provides programming for logic execution units LEU including the instruction selection of logic execution elements LEE and selector inputs of the pass units 701. As used herein, the set of programming needed to configure the logic execution array LEA 105 during one cycle of operation is termed an "instruction".

EIS memory 103 provides an element instruction stream EIS to the logic execution array 105. The element instruction stream stored in memory 103 is the basic abstraction element for design of the software programmable logic. EIS memory 103 stores logic execution element LEE and pass unit 701 configurations for logic execution array LEA 105 cycles not currently being executed. EIS memory 103 thereby represents the portion of the digital hardware design not currently being executed.

Based upon the size of logic execution array LEA 105, an instruction of the element instruction stream EIS is equivalent to one set of combinatorial computation in the design functionality. In this way, it can be part of the combinatorial design for a low level design. Alternately, sets of element instruction streams EIS can be used as basic elements when designing at a higher level of abstraction such as Register Transfer Level. Because the element instruction streams EIS provides programming each execution cycle, element instruction streams EIS enables the rapid reuse of a logic execution array LEA 105 and encompasses varied hardware design levels.

Although EIS memory 103 is shown as one physical memory in FIG. 10, many other embodiments are possible. Other such embodiments may use various distributed memory techniques. It is also expected that many types of memory, including, but not limited to sram, one-time-programmable, and rom, can be utilized according to the application space. The amount of EIS memory 103 is also scalable according to the application space.

Turning back to FIG. 5, integrated circuit 100 includes a sequencer 101. Sequencer 101 orders a sequence of element instruction stream EIS instructions to be executed. The sequence of element instruction stream EIS instructions to be executed provides the complete functionality of a digital algorithm.

One illustrative embodiment of integrated circuit 100 is targeted at providing about 512 element instruction system EIS instructions. When combined with a 256×16 logic execution element LEE array described below, this embodiment provides about 9.6 million available system gates.

Figure 11:
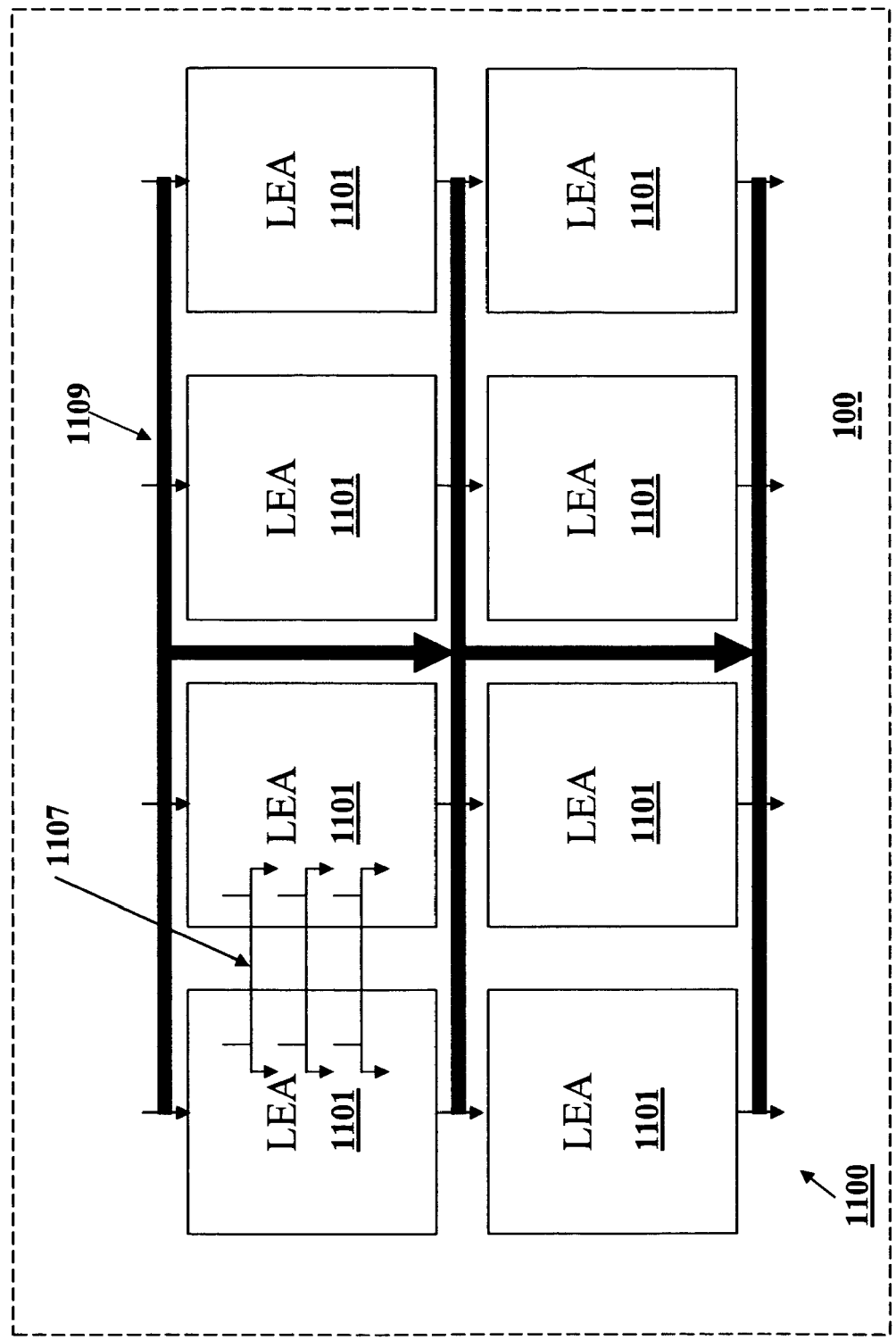
FIG. 11 illustrates schematically global interconnects between clusters of a logic execution array in accordance with the principles of the invention.

Turning now to FIG. 11, groups of logic execution elements LEE, pass units 701, and element instruction streams EIS are arranged into a cluster 1101 according to functional and physical implementation requirements. Clusters 1101 can be tiled in a horizontal manner to increase the available computational bandwidth of the array. Clusters 1101 can be tiled in a vertical manner to increase the combinatorial depth available in any single cycle. Pass units 701 can be connected to span adjacent clusters and global pass units 1107 can be connected to span remote clusters.

The operation of a larger virtual array 1100 comprising a plurality of clusters 1011 is intended to be similar to a single, physical logical execution array LEA 105. Clustering provides a mechanism to easily scale the design size according to the digital algorithms to be implemented. The clustering structure can be structured to manage physical constraints of implementation and retain the integrity of constant virtual timing. Accordingly, a heterogeneous physical array is used to create a homogeneous functional array.

Global pass units 1107, 1109, shown schematically in FIG. 11 provide interconnects between multiple clusters contained in a virtual logic execution array LEA 1100. Global pass units 1107, 1109 provide data interconnects between clusters 1101. Global pass units 1107 are provided between directly adjacent clusters 1101 and additional global pass units are provided between distant clusters 1101. In FIG. 11, adjacent global pass units 1107 are represented by small arrows. Global pass units 1109 between distant clusters 1101 are shown as the larger arrows that span entire rows in the center of the diagram. Although the data connections are shown outside of the individual clusters 1101, the global pass units 1109 can be implemented inside clusters 1101 with wire interconnects between clusters 1101. Global pass units 1109 in one embodiment are pass units 1107 modified with additional buffering to provide longer drive capability for inter-cluster interconnect.

Adjacent global pass units 1109 connections do not stop at the edge of a cluster 1101; pass units at a cluster edge have the same window as the global pass units 1109 in the center. Thus connections from adjacent clusters 1101 can be connected such that a cluster of logic execution arrays LEA work as a single unit. This allows computation data to flow through the complete virtual array 1100 in a fashion similar to intra-logic execution array LEA connections. Global pass units 1109 between distant clusters 1101 allow independent data to be supplied to remote logic execution arrays LEA without affecting inter-cluster data. In this way, algorithms can be more efficiently programmed into the virtual array at higher utilizations.

Virtual LEA array 1100 can be heterogeneous in nature. Different size logic execution arrays LEAs with various global interconnect can provide a more optimal implementation for certain classes of digital algorithms.

Figure 12:
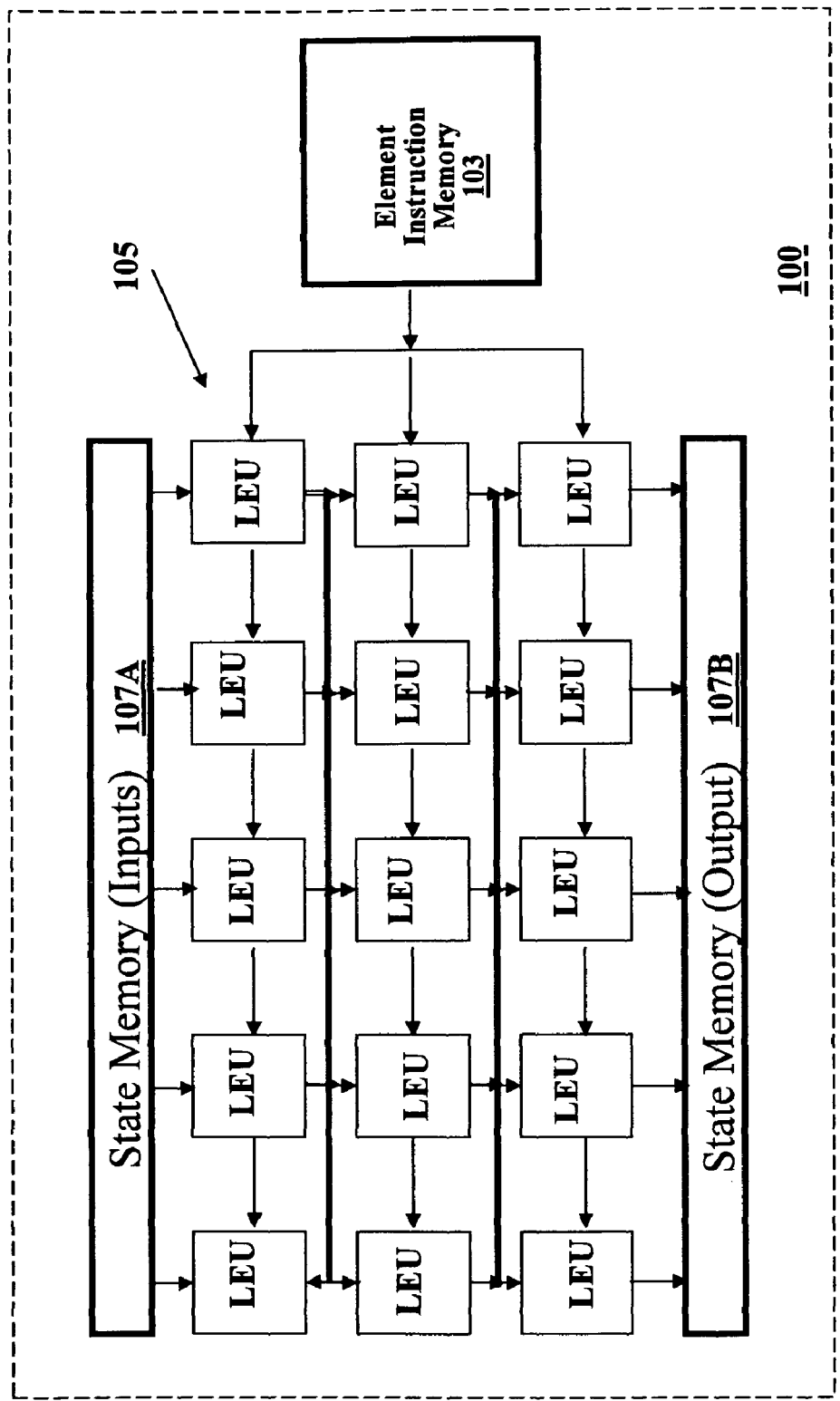
FIG. 12 illustrates a relationship between state memory, instruction memory and the logic execution array in accordance with the principles of the invention.

State memory 107 shown in FIG. 5 is used to preserve data between cycles of the array. State memory 107 is used to generate the initial inputs during an execution cycle of the array. State memory 107 is also used to preserve outputs after an execution cycle. In FIG. 12, state memory 107 is shown as comprising first and second portions 107A, 107B disposed, respectively, at the top and bottom of a logic execution array LEA 105. State memory portion 107A provides inputs to logic execution array LEA 105, and state memory portion 107B records logic execution array LEA 105 outputs. With this arrangement, state memory 107 can contain the algorithm inputs, outputs, and any intermediate values. State memory 107 performs a function similar to registers and nets in ASIC and FPGA designs. State memory 107 also performs a function similar to processor registers in software design.

Although two separate state memories portions 107A, 107B are shown, many configurations of state memory are possible in other embodiments. For example, memory portions 107A, 107B may be portions of a single physical memory.

Although not contained in the combinatorial logic element array LEA 105, state memory 107 provides the capability to aggregate data and removes registers from distribution in a traditional computational array. Sequencer 101 selects individual data from state memory 107 and correlates it to element instruction stream EIS instructions.

Because interconnect delay (RC) dominates smaller geometry integrated circuit fabrication technologies, future hardware architectures must manage data flow to minimize data interconnect. State memory 107 provides a mechanism to keep data aggregated and physically close to the programmable computational components; thereby, the effects of interconnect on data delay are mitigated. The combination of logic execution array LEA 105 and state memory 107 provides a hardware implementation that is more optimized for data delay than FPGA technology.

Traditional digital hardware design methods frequently use unique hardware for each set of digital computation. For example, an FPGA implementation might use an implementation requiring the two combinatorial computational stages shown in FIG. 4 to be implemented in unique hardware logic. Each of the logic gates shown in FIG. 4 would utilize a physically unique CLB in an FPGA implementation. Hardware resource sharing frequently remains unrealized because of partitioning design decisions or overhead associated with management of the resource sharing.

Figure 1:
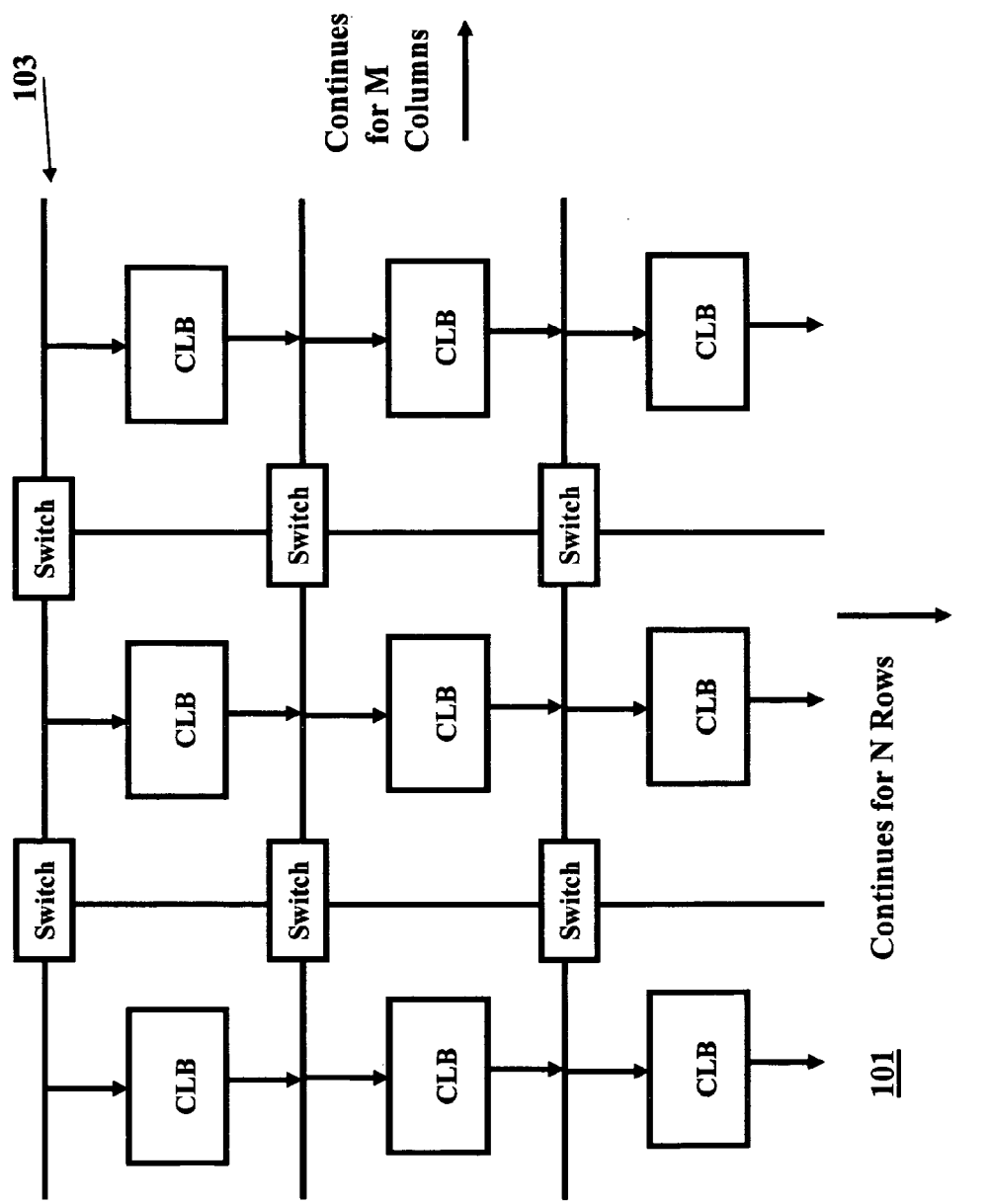
FIG. 1 illustrates a general architecture of prior art FPGA architectures.
Figure 2:
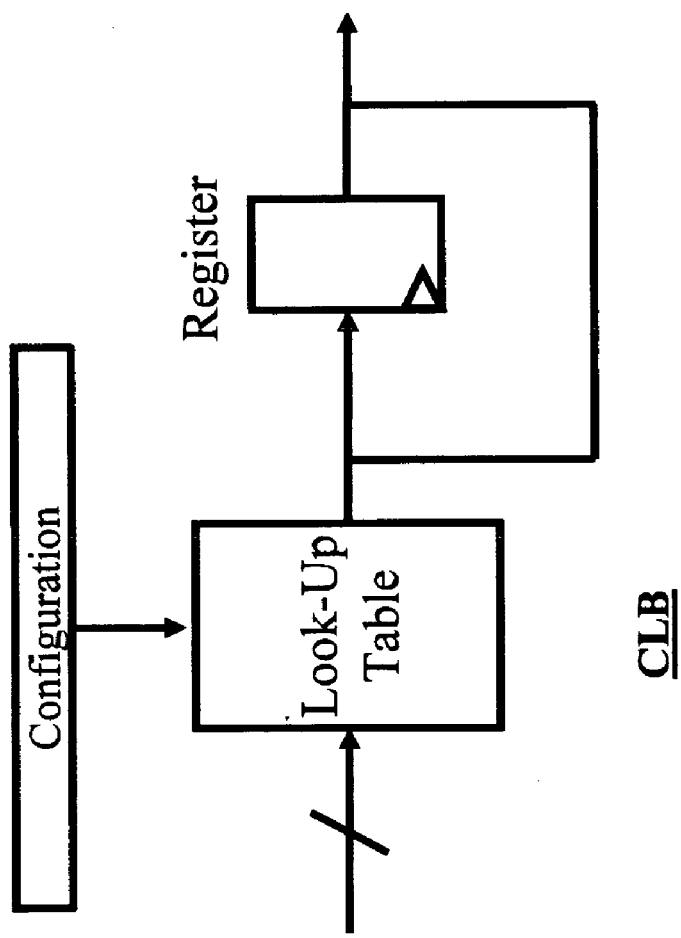
FIG. 2 illustrates a CLB architecture of prior art FPGA architectures.
Figure 3:
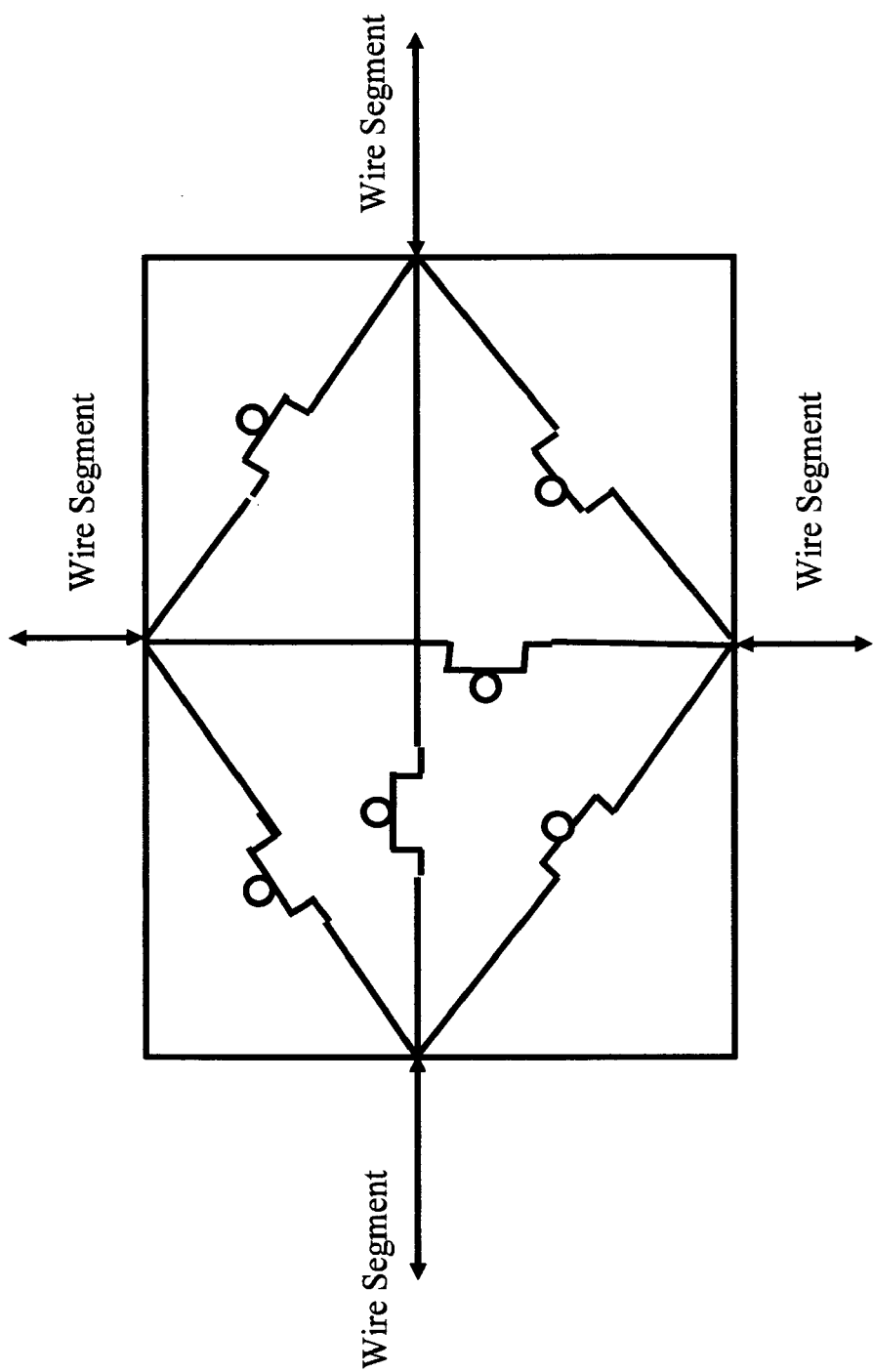
FIG. 3 illustrates a interconnect structure of prior art FPGA architectures.
Figure 4:
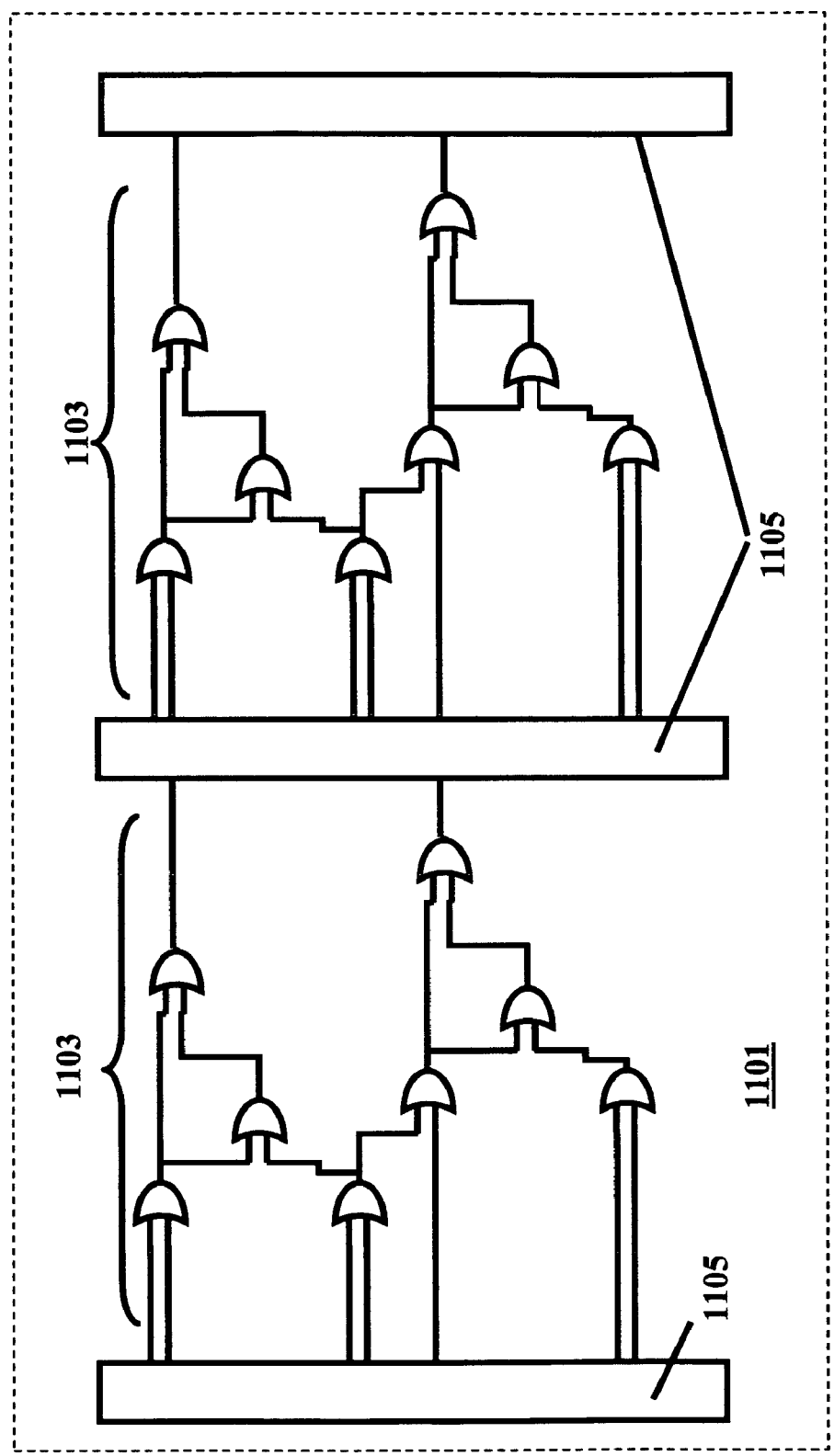
FIG. 4 illustrates a prior art combination of gate-level hardware elements that compute a digital algorithm.

Integrated circuit 100 computes the digital algorithm represented by the two combinatorial stages of FIG. 4 utilizing the same hardware by sharing. For example, logic execution array LEA 105 uses one cycle of execution to compute the function represented by the left side of combinatorial logic shown in FIG. 4 and another cycle of execution to compute the right side of the combinatorial logic of FIG. 4. Integrated circuit 100 reuses the same reconfigurable hardware to compute the various portions of a digital logic algorithm. Integrated circuit 100 achieves a more efficient implementation through inherent design reuse of hardware.

The design reuse of hardware can result in a more efficient implementation when there is a relationship between steps of a computation. In the example shown in FIG. 4, the right side stage of logic computation uses the data produced by the left side stage as inputs. This data is transported through the registers shown between stages. One important consequence of this dependence is that the right side stage only needs to be computed if the left side stage is computed. Additionally, the right side stage only needs to be computed if the data produced by the left side stage has changed. In this way, computation can be reduced with some knowledge about the timing and data flowing through the register stages. A traditional FPGA design would require an analysis of the structure of both the left and right logic computation of FIG. 4 to implement the advantages of data dependence. The inherent hardware reuse of logic execution arrays LEA 105 enables both the left and right computation blocks to realize the advantages of data dependence without analyzing the underlying implementation structure.

The invention has been described in terms of specific embodiments. It is not intended to limit scope of the invention by the embodiments shown and described. It will be apparent to those skilled in the art that various changes and modifications can be made to the embodiments without departing from the spirit or scope of the invention. It is intended to limit the invention only by the claims appended hereto, giving those claims the broadest permissible interpretation and scope permitted under the law.

What is claimed is:

1. A reconfigurable array to compute digital algorithms to operate on digital data comprising:
   an integrated circuit comprising:
      a plurality of data inputs;
      a plurality of data outputs;
      a plurality of programming inputs;
      a plurality of logic units arranged as a matrix array;
      said matrix array of logic units coupled to said data inputs and said data outputs;
      at least some of said logic units comprising a Boolean logic computational unit having input terminals, output terminals, and programming terminals, said programming terminals receiving a corresponding portion of said programming inputs, said computational unit being controlled by said portion of programming inputs such that digital signals at said output terminals have a predetermined Boolean combinatorial relationship to said digital signals, said logic units being operated on a clocked basis such that each said logic unit is controlled by said programming inputs;
      each of said logic units comprising a selector coupled to said input terminals and programmable to selectively couple input data from either said data inputs or output terminals of one or more other computational units to said computational unit; and
      an array of programmable interconnects interconnecting said data inputs of said matrix array and said output terminals of each of said logic units with input terminals of others of said logic units and to said data outputs of said matrix array;
      each of said logic units and each of said selectors and said array of programmable interconnects being operated on a clocked basis such that Boolean functionality is determined during each clock cycle.

2. A reconfigurable array in accordance with claim 1, wherein:
   said Boolean computational units are homogeneous.

3. A reconfigurable array in accordance with claim 1, wherein:
   said Boolean computational units are heterogeneous.

4. A reconfigurable array in accordance with claim 3, wherein:
   others of said logic units being selected from the group comprising: gate arrangements that produce pre-configured logic functions based upon data and instruction, arithmetic logic units, multipliers, adders and subtractors.

5. A reconfigurable array in accordance with claim 4, wherein:
   each of said logic units and each of said selectors and said array of programmable interconnects are programmed on a clocked basis such Boolean functionality of said integrated circuit is changed from clock cycle to clock cycle.

6. A reconfigurable array in accordance with claim 1, wherein:
   each of said logic units and each of said selectors and said array of programmable interconnects are programmed on a clocked basis such Boolean functionality of said integrated circuit is changed from clock cycle to clock cycle.

7. A reconfigurable array in accordance with claim 1, wherein:
   each said logic unit selector comprises unidirectional interconnect elements.

8. A reconfigurable array in accordance with claim 1, wherein:
   each said logic unit selector comprises a plurality of multiplexors.

9. A reconfigurable array in accordance with claim 1, wherein:
   each said logic unit selector has its inputs coupled to the outputs.

10. A reconfigurable array in accordance with claim 1, wherein:
    each of said logic units and each of said selectors and said array of programmable interconnects being operated and programmed such that Boolean functionality of said integrated circuit may change from clock cycle to clock cycle.

11. A reconfigurable array in accordance with claim 1, wherein:
    each of said data inputs is coupleable to a state memory for receiving input data from as state memory; and
    each of said data outputs is coupleable to said state memory for providing output data to said state memory.

12. A reconfigurable array to compute digital algorithms to operate on digital data comprising:
    an integrated circuit comprising:
       a plurality of programmable clusters, each of said clusters comprising:
          a plurality of data inputs;
          a plurality of data outputs;

a plurality of programming inputs;

a plurality of logic units arranged as a matrix array;

said matrix array of logic units coupled to said data inputs and said data outputs;

at least some of said logic units comprising a Boolean logic computational unit having input terminals, output terminals, and programming terminals, said programming terminals receiving a corresponding portion of said programming inputs, said computational unit being controlled by said portion of programming inputs such that digital signals at said output terminals have a predetermined Boolean combinatorial relationship to said digital signals, said logic units being operated on a clocked basis such that each said logic unit is controlled by said programming inputs;

each of said logic units comprising a selector coupled to said input terminals and programmable to selectively couple input data from either said data inputs or output terminals of one or more other computational units to said computational unit; and an array of programmable interconnects interconnecting said data inputs of said matrix array and said output terminals of each of said logic units with input terminals of others of said logic units and to said data outputs of said matrix array;

each of said logic units and each of said selectors and said array of programmable interconnects being operated on a clocked basis such that Boolean functionality is determined during each clock cycle.

13. A reconfigurable array in accordance with claim 12, comprising:

global pass units coupling said plurality of clusters, said global pass units being programmable and operated on a clocked basis.

14. A reconfigurable array in accordance with claim 13, wherein:

said plurality of clusters are tiled in a horizontal manner to provide increased computational bandwidth of said reconfigurable array.

15. A reconfigurable array in accordance with claim 13, wherein:

said plurality of clusters are tiled in a vertical manner to provide increased combinatorial depth of said reconfigurable array.

16. A reconfigurable array in accordance with claim 15, wherein:

said plurality of clusters are tiled in a horizontal manner to provide increased computational bandwidth of said reconfigurable array.

17. A method for computing digital algorithms to operate on digital data comprising:

providing an integrated circuit comprising having a plurality of data inputs, a plurality of data outputs and a plurality of programming inputs;

providing on said integrated circuit a plurality of logic units;

arranging said plurality of logic units as a matrix array;

coupling said matrix array of logic units to said data inputs and said data outputs;

providing at least some of said logic units as a Boolean logic computational unit each having input terminals, output terminals, and programming terminals;

receiving at said programming terminals of each of said logic units a corresponding portion of said programming inputs;

controlling each said logic unit by said corresponding portion of programming inputs such that digital signals at said output terminals have a predetermined Boolean combinatorial relationship to said digital signals;

operating each of said logic units on a clocked basis such that each said logic unit is controlled by said corresponding portion of said programming inputs;

providing each of said logic units with a selector coupled to said input terminals and programmable to selectively couple input data from either said data inputs or output terminals of one or more other computational units to said computational unit;

providing an array of programmable interconnects interconnecting said data inputs of said matrix array and said output terminals of each of said logic units with input terminals of others of said logic units; and operating each of said logic units and each of said selectors and said array of programmable interconnects on a clocked basis such that Boolean functionality is determined during each clock cycle.

18. A method for computing digital algorithms to operate on digital data in accordance with claim 17, comprising:

providing said matrix array as a homogenous array of logic units.

19. A method for computing digital algorithms to operate on digital data in accordance with claim 17, comprising:

providing said matrix array as heterogeneous array of logic units.

20. A method for computing digital algorithms to operate on digital data in accordance with claim 19, comprising:

selecting others of said logic units being selected from the group comprising: gate arrangements that produce preconfigured logic functions based upon data and instruction, arithmetic logic units, multipliers, adders and subtractors.

21. A method for computing digital algorithms to operate on digital data in accordance with claim 20, comprising:

operating each of said logic units and each of said selectors and said array of programmable interconnects on a clocked basis such Boolean functionality of said integrated circuit is changed from clock cycle to clock cycle.

22. A method for computing digital algorithms to operate on digital data in accordance with claim 17, comprising:

programming each of said logic units and each of said selectors and said array of programmable interconnects on a clocked basis such Boolean functionality of said integrated circuit is changed from clock cycle to clock cycle.

23. A method for computing digital algorithms to operate on digital data in accordance with claim 17, comprising:

operating each said logic unit selector as a unidirectional interconnect element.

24. A method for computing digital algorithms to operate on digital data in accordance with claim 17, comprising:

receiving input data at each of said data from a state memory; and providing output data at each of said data outputs to said state memory.

25. A method for computing digital algorithms to operate on digital data, comprising:

providing an integrated circuit comprising having a plurality of data inputs, a plurality of data outputs and a plurality of programming inputs;

providing on said integrated circuit a plurality of clusters of logic units, each of said clusters comprising a plurality of logic units arranged as a matrix array;

providing at least some of said logic units as a Boolean logic computational unit each having input terminals, output terminals, and programming terminals;

receiving at said programming terminals of each of said logic units a corresponding portion of said programming inputs;

controlling each said logic unit by said corresponding portion of programming inputs such that digital signals at said output terminals have a predetermined Boolean combinatorial relationship to digital signals at said input terminals;

operating each of said logic units on a clocked basis such that each said logic unit is controlled by said corresponding portion of said programming inputs;

providing each of said logic units with a selector coupled to said input terminals and programmable to selectively couple input data from either said data inputs or output terminals of one or more other computational units to said computational unit;

providing an array of programmable interconnects interconnecting said data inputs of said matrix array and said output terminals of each of said logic units with input terminals of others of said logic units; and operating each of said logic units and each of said selectors and said array of programmable interconnects on a clocked basis such that Boolean functionality is determined during each clock cycle.

26. A method for computing digital algorithms to operate on digital data in accordance with claim 25, comprising:

providing global pass units coupling said plurality of clusters, said global pass units being programmable and operable on a clocked basis.

27. A method for computing digital algorithms to operate on digital data in accordance with claim 26, comprising:

configuring said plurality of clusters in a horizontal tiled manner to provide increased computational bandwidth of said reconfigurable array.

28. A method for computing digital algorithms to operate on digital data in accordance with claim 25, comprising:

configuring at least some of said plurality of clusters in a vertical tiled manner to provide increased combinatorial depth of said reconfigurable array.

29. A method for computing digital algorithms to operate on digital data in accordance with claim 28, comprising:

configuring some of said plurality of clusters in a tiled horizontal manner to provide increased computational bandwidth of said reconfigurable array.

* * * * *